United States Patent [19]

Hascoe

[11] 4,192,433
[45] Mar. 11, 1980

[54] HERMETIC SEALING COVER FOR A CONTAINER FOR SEMICONDUCTOR DEVICES

[75] Inventor: Norman Hascoe, Larchmont, N.Y.

[73] Assignee: Semi-Alloys, Inc., Mount Vernon, N.Y.

[21] Appl. No.: 4,654

[22] Filed: Jan. 19, 1979

[51] Int. Cl.² ...................... B65D 41/00; B65D 43/00; B65D 51/00

[52] U.S. Cl. .................................. 220/200; 220/359; 174/52 S; 174/52 FP

[58] Field of Search ............... 220/200, 457, 359, 363; 174/52 S, 52 FP; 156/330, 60, 306; 206/813; 29/588; 219/87

[56] References Cited

U.S. PATENT DOCUMENTS

| | | | |
|---|---|---|---|
| 3,874,549 | 4/1975 | Hascoe | 220/200 |
| 4,109,818 | 8/1978 | Hascoe | 220/200 |

Primary Examiner—George T. Hall
Attorney, Agent, or Firm—Laurence B. Dodds

[57] ABSTRACT

A cover unit for hermetically sealing a container for a semiconductor device comprises a metallic cover element, a preformed ring of substantially chemically unreacted thermosetting plastic and a preformed ring of an alloy consisting of about 63% tin and 37% lead having the characteristic that it solidifies from the fluid state as a homogeneous mixture and a relatively thin oxidation-resistant coating clad on the ring and consisting of about 96.5% tin and 3.5% silver. One of the rings is disposed substantially in registry with the periphery of the cover element and the other of the rings is nested closely inside the one ring. Each of the rings may be either rectangular or circular in cross-section. Upon heating the cover units, the two rings are fused to each other, to the cover element, and to the container being sealed.

9 Claims, 3 Drawing Figures

HERMETIC SEALING COVER FOR A CONTAINER FOR SEMICONDUCTOR DEVICES

CROSS-REFERENCE TO RELATED APPLICATION

A preferred form of the sealing cover unit of the invention uses a solder preform of the type described and claimed in applicant's copending application Ser. No. 964,365, filed Nov. 28, 1978, and entitled "Solder Preform."

BACKGROUND OF THE INVENTION

1. Field of the Invention

The hermetic sealing cover of the invention is of particular utility in hermetically sealing a container in which is enclosed one or more semiconductor devices, such as integrated circuits which must be protected from exposure to ambient atmosphere.

2. Description of the Prior Art

In the manufacture of semiconductor devices, there has been a requirement for hermetically sealing the container in which the active semiconductor device is housed, usually a cavity in a metallic or ceramic body. For this purpose, a metallic cover and a solder preform ring have been used. In accordance with current general practice, the solder preform ring is preattached to the sealing cover and the resulting unit disposed over the container of the semiconductor device and heated to fuse the solder preform to the cover and to the container as described and claimed in applicant's U.S. Pat. Nos. 3,823,468 and 3,874,549.

In the foregoing method of fabricating hermetically sealed semiconductor packages, it has been customary to use a solder preform formed of an eutectic alloy comprising substantially 80% gold and 20% tin, which has the advantages that it has a desirably high melting point of about 280° C. and it has a high tensile strength, ensuring against breaking of the seal due to shocks or rough handling of the semiconductor package. While such solder preforms are eminently satisfactory in use, the recent extreme increase in the price of gold has made them very costly.

One modification of the foregoing practice adopted to effect a cost saving and which has gone into commercial use comprises a nickel-plated metal cover having an attached preform of substantially chemically unreacted plastic material such as an epoxy resin, as described and claimed in applicant's U.S. Pat. No. 4,109,818 issued Aug. 29, 1978. An outstanding advantage of such a plastic preform is the extremely good adhesion that obtains between the cover and the cavity sealing ring of the semiconductor package. However, from a rigorous viewpoint, the seal effected by such a plastic preform cannot be considered truly hermetic. For example, a gold-tin eutectic solder preform produces an hermetic seal such that the leak rate does not exceed $1 \times 10^{-8}$ c.c. of helium per second at a differential pressure across the seal of the order of one atmosphere, while the plastic sealing rings are customarily only warranted to a leak rate of $1 \times 10^{-6}$ c.c. of helium per second. In some applications, this higher leak rate is acceptable while in other applications the leak rate of $1 \times 10^{-8}$ c.c. of helium per second is required.

It is an object of the present invention, therefore, to provide a new and improved hermetic sealing cover for a container for a semiconductor device which combines the superior adhesion properties of a plastic sealing ring with the superior hermetic sealing properties of a metallic solder preform.

SUMMARY OF THE INVENTION

In accordance with the invention, a cover unit for hermetically sealing a container for a semiconductor device comprises a metallic cover element, a preformed ring of substantially chemically unreacted thermosetting plastic, and a preformed ring of an alloy having the characteristic that it solidifies from the fluid state as a homogeneous mixture and a relatively thin oxidation-resistant coating thereon. One of the rings is disposed substantially in registry with the periphery of the cover element and the other of the rings is nested closely inside the one ring, whereby, upon heating the cover unit, the two rings are fused to each other and to the cover element.

For a better understanding of the present invention, together with other and further objects thereof, reference is had to the following description, taken in connection with the accompanying drawing, while its scope will be pointed out in the appended claims.

BRIEF DESCRIPTION OF THE DRAWING

FIG. 2 is a cross-sectional view of the cover of FIG. 1 along the line 2—2; while

DESCRIPTION OF THE PREFERRED EMBODIMENTS

Figure 1:
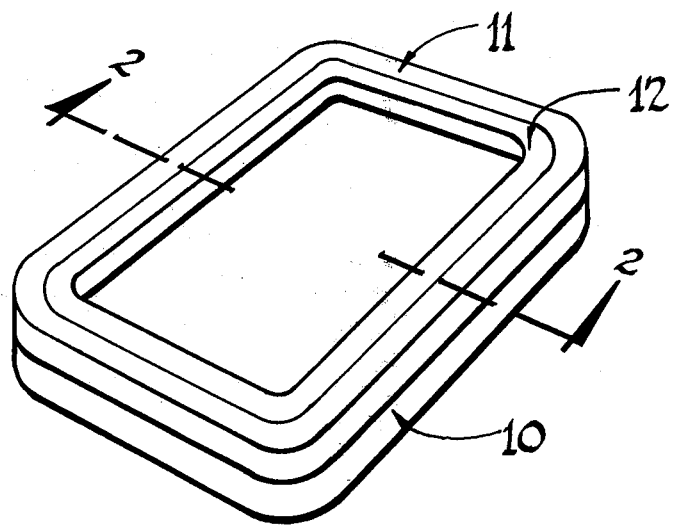
FIG. 1 is a perspective view of an hermetic sealing cover embodying the invention.
Figure 2:
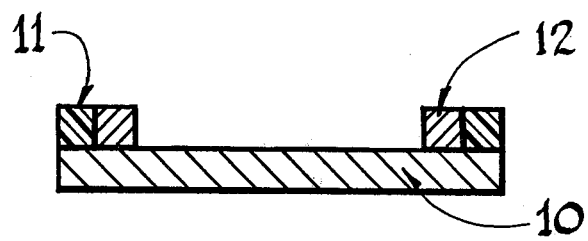

Referring now to FIGS. 1 and 2 of the drawing, there is shown a cover unit for hermetically sealing a container for a semiconductor device comprising a metallic cover element 10 and a preformed ring 11 of substantially chemically unreacted thermosetting plastic such as epoxy. the ring 11 being disposed in substantial registry with the periphery of the cover element 10. The partially cured epoxy ring 11 retains a tacky exterior which adheres to the cover element 10.

The cover unit of FIG. 1 further comprises a preformed ring 12 of a metal alloy having the characteristic that it solidifies from the fluid state as a homogeneous mixture and consisting of 60% to 66% tin and 40% to 34% lead, preferably about 63% tin and 37% lead. The metal alloy ring 12 has a relatively thin oxidation-resistant coating clad thereon, preferably comprising an alloy consisting of about 96.5% tin and 3.5% silver. As shown in FIG. 1, the metal alloy ring 12 is nested closely inside the plastic ring 11. The metal alloy ring is attached to the cover element by spot-fusing at a plurality of spaced points as described in aforesaid U.S. Pat. No. 3,874,549.

Figure 3:
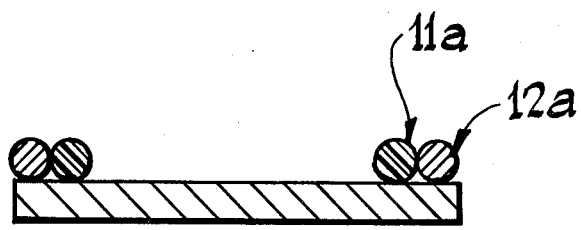
FIG. 3 is a cross-sectional view of a modified form of hermetic sealing cover embodying the invention.

In FIG. 3 is represented a modified form of the invention in which both the plastic ring 11a and the metal alloy ring 12a are circular in cross-section and in which the order of the metal alloy ring and plastic ring are reversed, that is, the plastic ring is nested inside the metal alloy ring.

In the sealing cover units described above, the metal alloy ring 12 or 12a has the characteristic of not requiring a flux when sealed in a reducing or neutral (nitrogen) atmosphere. Furthermore, the metal alloy ring has a sealing temperature very near the curing temperature of the epoxy plastic preform ring 11 or 11a. Such epoxy plastic preform has a curing temperature between 170° C. and 210° C. The eutectic alloy solder ring 12 or 12a melts at 180° C., dissolving its tin-plating and wetting both the surfaces of the cover element 10 and the sealing ring of the ceramic or metal package which is being sealed. Either gold- or silver- or tin-plating on the cover element 10 and sealing ring of the semiconductor package works well with the tin-silver plated eutectic tin-lead solder ring 12 or 12a.

The use of the dual sealing rings produces a hermetic seal because of the metal alloy ring 12 or 12a and a high reliability seal because of the superior adhesion characteristics of the plastic epoxy sealing ring 11 or 11a. Semiconductor packages have been sealed in this manner having the required hermeticity of less than $1 \times 10^{-8}$ c.c. per second helium leak rate and pass all environmental conditions.

A secondary advantage of the plastic sealing ring on the outside of the metal alloy sealing ring is the prevention of corrosion of the metal alloy ring after sealing of the semiconductor package. The plastic epoxy sealing ring acts as a barrier for most reactive chemicals and prevents the tin-lead alloy ring from oxidizing and from being attacked by active chemicals.

While there have been described what are, at present, considered to be the preferred embodiments of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. A cover unit for hermetically sealing a container for a semiconductor device comprising:
   a metallic cover element;
   a preformed ring of substantially chemically unreacted thermosetting plastic;
   and a preformed ring of an alloy having the characteristic that it solidifies from the fluid state as a homogeneous mixture and a relatively thin oxidation-resistant coating thereon,
   one of said rings being disposed substantially in registry with the periphery of the cover element and the other of said rings being nested closely inside said one ring,
   whereby, upon heating the cover unit, the two rings are fused to each other and to the cover element.

2. A hermetic sealing cover unit in accordance with claim 1 in which the ring alloy consists of 60% to 66% tin and 40% to 34% lead.

3. A hermetic sealing cover unit in accordance with claim 1 in which the ring alloy consists of about 63% tin and 37% lead.

4. A hermetic sealing cover unit in accordance with claim 1 in which said oxidation-resistant coating is clad on the alloy ring.

5. A hermetic sealing cover unit in accordance with claim 1 in which the oxidation-resistant coating is an alloy consisting of about 96.5% tin and 3.5% silver.

6. A hermetic sealing cover unit in accordance with claim 1 in which said alloy ring is nested inside said plastic ring.

7. A hermetic sealing cover unit in accordance with claim 1 in which said plastic ring is nested inside said alloy ring.

8. A hermetic sealing cover unit in accordance with claim 1 in which each of said rings is rectangular in cross-section.

9. A hermetic sealing cover unit in accordance with claim 1 in which each of said rings is circular in cross-section.

* * * * *